United States Patent
Thorp et al.

(10) Patent No.: US 7,697,329 B2
(45) Date of Patent: Apr. 13, 2010

(54) METHODS AND APPARATUS FOR USING A CONFIGURATION ARRAY SIMILAR TO AN ASSOCIATED DATA ARRAY

(75) Inventors: Tyler Thorp, Sunnyvale, CA (US); Brent Haukness, Monte Sereno, CA (US)

(73) Assignee: Sandisk 3D LLC, Milpitas, CA (US)

( * ) Notice: Subject to any disclaimer, the term of this patent is extended or adjusted under 35 U.S.C. 154(b) by 270 days.

(21) Appl. No.: 11/669,923

(22) Filed: Jan. 31, 2007

(65) Prior Publication Data

US 2008/0184005 A1 Jul. 31, 2008

(51) Int. Cl.
*G11C 16/04* (2006.01)

(52) U.S. Cl. .......................... 365/185.05; 365/185.16; 365/185.2; 711/170; 711/172; 710/8; 710/10

(58) Field of Classification Search ............ 365/185.05, 365/185.16, 185.2; 711/170, 172; 710/8, 710/10

See application file for complete search history.

(56) References Cited

U.S. PATENT DOCUMENTS

| | | | |
|---|---|---|---|
| 5,737,766 A * | 4/1998 | Tan .............................. | 711/170 |
| 6,504,753 B1 * | 1/2003 | Scheuerlein et al. ......... | 365/175 |
| 6,687,146 B2 * | 2/2004 | Kurjanowicz et al. ......... | 365/63 |
| 2008/0184004 A1 * | 7/2008 | Thorp et al. ................. | 711/170 |
| 2008/0184057 A1 | 7/2008 | Thorp et al. | |
| 2008/0184065 A1 * | 7/2008 | Thorp et al. .................... | 714/6 |

OTHER PUBLICATIONS

Johnson et al., "512-Mb PROM With a Three-Dimensional Array of Diode/Antifuse Memory Cells", Nov. 2003, IEEE Journal of Solid-State Circuits, vol. 38, No. 11, pp. 1920-1928.

* cited by examiner

*Primary Examiner*—VanThu Nguyen
*Assistant Examiner*—Eric Wendler
(74) *Attorney, Agent, or Firm*—Dugan & Dugan, PC

(57) ABSTRACT

Methods, apparatus, and systems in accordance with this invention include memories that include a data array and a configuration array adapted to store configuration information for configuring the data array. The data array and the configuration array include a plurality of wordlines and a plurality of bitlines. The plurality of wordlines in the data array extend in the same direction as the plurality of wordlines in the configuration array. Likewise, the plurality of bitlines in the data array extend in the same direction as the plurality of bitlines in the configuration array. The configuration array may include a wordline driver layout, a bitline driver layout, relative positions of zia contact regions, a diode sensing orientation, a sense amplifier layout, a voltage regulator layout, and a layout of conductors proximate to the array that are each substantially similar to corresponding elements of the data array. Numerous other aspects are disclosed.

24 Claims, 3 Drawing Sheets

METHODS AND APPARATUS FOR USING A CONFIGURATION ARRAY SIMILAR TO AN ASSOCIATED DATA ARRAY

RELATED APPLICATIONS

The present application is related to commonly owned, U.S. patent application Ser. No. 11/669,919, "METHODS AND APPARATUS FOR USING A CONFIGURATION ARRAY SIMILAR TO AN ASSOCIATED DATA ARRAY," filed on Jan. 31, 2007, which is hereby incorporated by reference.

The present application is also related to commonly owned, U.S. patent applications Ser. Nos. 11/669,917 and 11/669,918, "METHODS AND APPARATUS FOR EMPLOYING REDUNDANT ARRAYS TO CONFIGURE NON-VOLATILE MEMORY," both filed on Jan. 31, 2007, which are hereby incorporated by reference.

FIELD OF THE INVENTION

The present application relates to memory arrays, and more specifically, the present invention relates to configuration arrays used to program or configure data arrays.

BACKGROUND

Non-volatile memory arrays designed for storing user data, for example, within various memory devices such as secure digital (SD) cards, memory sticks, compact flash cards, USB flash drives, picture cards, etc., may be configured using information stored within the memory devices. In some cases, the configuration information may be critical for the operation of the memory array. Thus, what is needed are methods and apparatus to cost effectively and reliably manufacture configuration arrays for storing and accessing configuration information associated with a memory device.

SUMMARY OF THE INVENTION

In some aspects, the present invention provides a memory that includes a substrate including a data array, and a configuration array associated with the data array and adapted to store configuration information for configuring the data array. The configuration array and the data array are disposed on the substrate in a same orientation as each other relative to the substrate. The configuration array includes a plurality of zia contact regions that are disposed in substantially similar relative locations in the configuration array as a plurality of zia contact regions disposed in the data array.

In other aspects, the present invention provides a non-volatile memory system including a data array, and a configuration array associated with the data array. The configuration array and the data array are disposed in a same orientation relative to each other. The configuration array includes a plurality of zia contact regions that are disposed in substantially similar relative locations in the configuration array as a plurality of zia contact regions disposed in the data array.

In yet other aspects, the present invention provides a memory including a substrate including a data array, and a configuration array associated with the data array and adapted to store configuration information for configuring the data array. The configuration array includes a plurality of bitline drivers that are laid out substantially similar to a plurality of bitline drivers of the data array. The configuration array includes a diode sensing orientation that is substantially similar to a diode sensing orientation of the data array.

In still yet other aspects, the present invention provides a memory including a substrate including a data array, and a configuration array associated with the data array and adapted to store configuration information for configuring the data array. The configuration array includes a plurality of wordline drivers that are laid out substantially similar to a plurality of wordline drivers of the data array. The configuration array includes a plurality of conductors proximate to the configuration array that are laid out substantially similar to a plurality of conductors proximate to the data array.

In further aspects, the present invention provides a non-volatile memory system including a data array, and a configuration array associated with the data array and adapted to store configuration information for configuring the data array. The data array and the configuration array include a plurality of wordlines and a plurality of bitlines. The plurality of wordlines in the data array extend in a first direction and the plurality of wordlines in the configuration array extend in the first direction. The plurality of bitlines in the data array extend in a second direction and the plurality of bitlines in the configuration array extend in the second direction. The configuration array includes a plurality of wordline drivers that are laid out substantially similar to a layout of a plurality of wordline drivers of the data array. The configuration array includes a plurality of bitline drivers that are laid out substantially similar to a layout of a plurality of bitline drivers of the data array. The configuration array includes a plurality of zia contact regions that are disposed in substantially similar relative locations in the configuration array to a plurality of zia contact regions disposed in the data array. The configuration array includes a diode sensing orientation that is substantially similar to a diode sensing orientation of the data array. The configuration array includes a plurality of sense amplifiers that are laid out substantially similar to a plurality of sense amplifiers of the data array. The configuration array includes a plurality of voltage regulators that are laid out substantially similar to a plurality of voltage regulators of the data array. The configuration array includes a plurality of conductors proximate to the configuration array that are laid out substantially similar to a plurality of conductors proximate to the data array.

In yet further aspects, the present invention provides a method including orienting a data array on a substrate disposed in a first orientation; orienting a configuration array on the substrate disposed in the first orientation, and disposing a plurality of zia contact regions in the configuration array in substantially similar relative locations as a plurality of zia contact regions disposed in the data array. The configuration array is associated with the data array.

In still yet further aspects, the present invention provides a method including orienting a data array on a substrate disposed in a first orientation; orienting a configuration array on the substrate disposed in the first orientation; laying out a wordline driver for use with the configuration array that is substantially similar to a layout of wordline driver used with the data array; laying out a bitline driver for use with the configuration array that is substantially similar to a layout of a bitline driver used with the data array; disposing a plurality of zia contact regions in the configuration array in substantially similar relative locations as a plurality of zia contact regions disposed in the data array; selecting a diode sensing orientation for the configuration array that is substantially similar to a diode sensing orientation of the data array; laying out a sense amplifier for use with the configuration array that is substantially similar to a layout of a sense amplifier used with the data array; laying out a voltage regulator for use with the configuration array that is substantially similar to a layout of a voltage regulator used with the data array; and laying out a plurality of conductors proximate to the configuration array substantially similar to a layout of a plurality of conductors proximate to the data array. The configuration array is associated with the data array and adapted to store configuration information for configuring the data array. The data array and the configuration array each includes a plurality of wordlines and a plurality of bitlines. The plurality of wordlines in the data array extend in a first direction and the plurality of wordlines in the configuration array extend in the first direction. The plurality of bitlines in the data array extend in a second direction and the plurality of bitlines in the configuration array extend in the second direction. Orienting a configuration array includes aligning the wordlines in the configuration array substantially parallel with the wordlines in the data array and aligning the bitlines in the configuration array substantially parallel with the bitlines in the data array.

In additional aspects, the present invention provides a method including disposing a data array on a substrate; disposing a configuration array on the substrate in an orientation substantially similar to an orientation of the data array; and disposing a plurality of zia contact regions in the configuration array in substantially similar relative locations as a plurality of zia contact regions disposed in the data array. The configuration array is associated with the data array and adapted to store configuration information for configuring the data array.

In yet additional aspects, the present invention provides a method including disposing a data array on a substrate; disposing a configuration array on the substrate; laying out a bitline driver for use with the configuration array that is substantially similar to a layout of a bitline driver of the data array; and selecting a diode sensing orientation for the configuration array that is substantially similar to a diode sensing orientation of the data array. The configuration array is associated with the data array and adapted to store configuration information for configuring the data array.

In still yet additional aspects, the present invention provides a method including disposing a data array on a substrate; disposing a configuration array on the substrate; laying out a wordline driver for use with the configuration array that is substantially similar to a layout of a wordline driver of the data array; and laying out a plurality of conductors proximate to the configuration array substantially similar to a layout of a plurality of conductors proximate to the data array. The configuration array is associated with the data array and adapted to store configuration information for configuring the data array.

Other features and aspects of the present invention will become more fully apparent from the following detailed description, the appended claims and the accompanying drawings.

DETAILED DESCRIPTION

Figure 1:
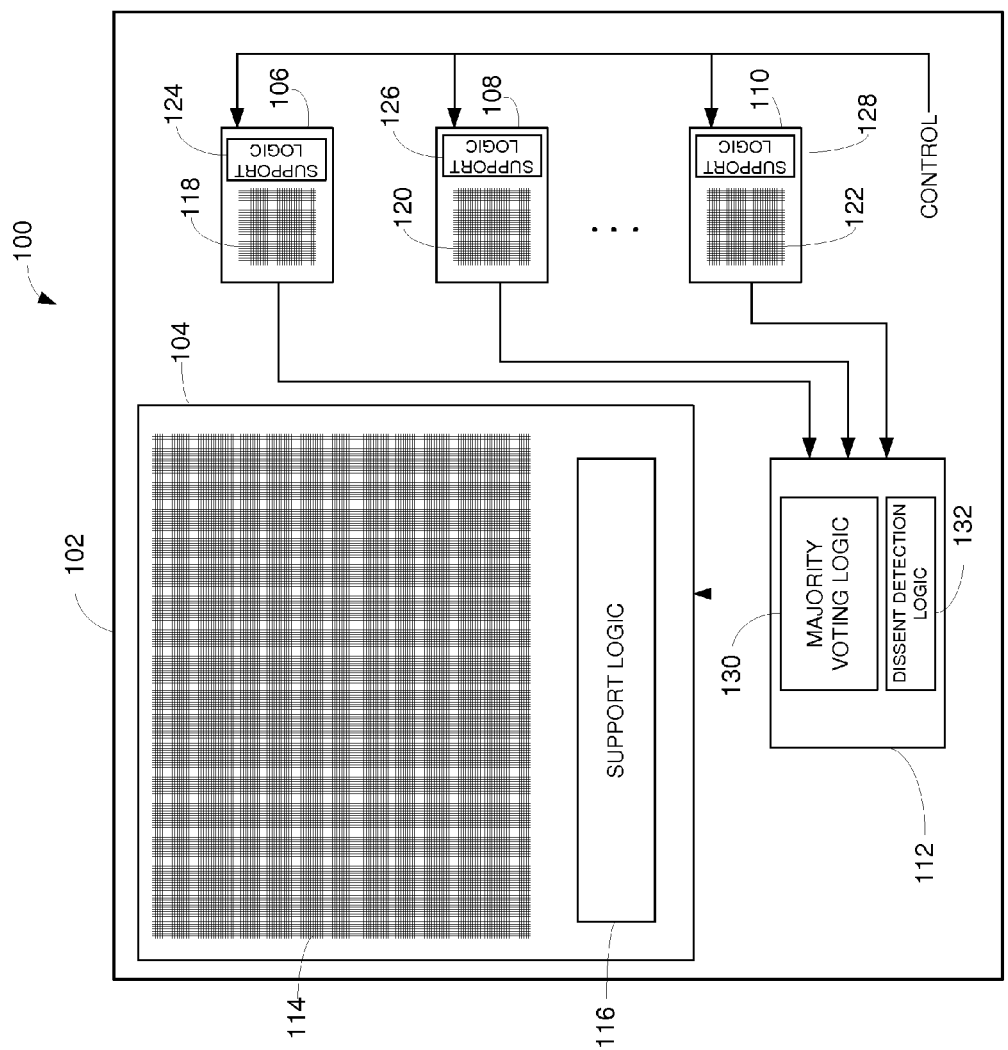
FIG. 1 is a schematic block diagram that depicts a memory system according to some embodiments of the present invention.

The present invention provides systems, methods, and apparatus for employing a configuration array that is substantially similar to an associated data array. One or more configuration arrays may be included in a non-volatile memory device to store configuration information for configuring and using the primary data array of the device. Typically, due to the large size of the data array, a primary design consideration in designing the data array is to minimize the amount of substrate area used. Thus, compromises may be made with respect to other design concerns such as, for example, the reference used for voltage regulators. Therefore, in some memory array designs, even though ground may provide a less noisy reference, a data array's voltage regulators may be referenced to a voltage supply of the circuit to achieve a more efficient use of substrate area. This design choice influences the orientation of the wordlines and the bitlines (e.g., the direction that the wordlines and bitlines run on the substrate) that are the conductors used to bias and sense, respectively, the cells of the configuration array.

In contrast to the data array, a configuration array, which is typically much smaller than the associated data array, may have robustness and power-up speed as a primary design consideration. Thus, the configuration array may be designed to use ground as a voltage reference since ground is electrically quieter compared to the voltage supply, particularly at power-up time. This design choice for the configuration array results in an orientation of wordlines and bitlines that are rotated ninety degrees compared to the wordlines and bitlines of the data array. As a consequence, designers of memory devices that have both (1) large data arrays and (2) associated fast-booting configuration arrays (e.g., configuration arrays that are required to boot-up and be read quickly) may be inclined to use a different orientation (e.g., arrangement of wordlines and bitlines) for the configuration array than for the data array. In other words, the primary design considerations for data arrays and those for configuration arrays would ordinarily lead to significantly different memory array designs. The designs may vary not just in terms of whether or not ground is used as a voltage reference, but also in terms of the orientation of the wordlines and bitlines of the arrays relative to the substrate, the side of the diode sensed in a two terminal memory cell, the wordline/bitline layout (including optical proximity corrections (OPC)), the layout of the wordline/bitline drivers (e.g., the last stage decoders), the relative locations of zia contact regions (e.g., a zia being a vertical interconnect that spans more than two interconnect layers), the layout of the sense amplifiers, the layout of the voltage regulators, etc.

The inventors of the present invention have determined that despite the above reasons to build and arrange configuration arrays differently than data arrays, it is preferable to use configuration arrays that are substantially similar to data arrays in terms of most key elements except, of course, size. In particular, by disposing a configuration array on a substrate with the same orientation of wordlines and bitlines as the data array's orientation of wordlines and bitlines, both reliability and yield of the system are improved. In some cases, the improvements may be realized in correcting for the effects of defects that may occur during manufacturing. For example, if during the process development stage of manufacturing, a process sensitivity is identified in the data array that can be compensated for by making an adjustment (e.g., widening conductor lines running in one direction and/or narrowing conductor lines running a perpendicular direction), making the adjustment would result in improving the data array and adversely affecting the configuration array when the data array and the configuration array are not disposed in the same orientation on the substrate (as would be the case in a conventional memory design that follows conventional design considerations). However, if the data array and the configuration array are disposed in the same orientation, the adjustment can be made without ill affects. Likewise, if other elements (e.g., the side of the diode sensed, the wordline/bitline layout (including the OPC), the layout of the wordline/bitline drivers, the relative locations of zia contact regions, the layout of the sense amplifiers, the layout of the voltage regulators, the layout of wordlines/bitlines where they narrow as they enter the array, etc.) of the configuration array and data array are the same (or substantially similar), process changes will affect the arrays in the same way and the occurrence of different adverse effects on the two arrays may be avoided.

Turning to FIG. 1, a memory system 100 according to present invention may be embodied on a substrate 102, for example, such as on a semiconductor substrate. The system 100 may include a primary or data array 104 and one or more configuration arrays 106, 108, 110 each coupled to the data array via logic 112. The data array 104 may be used to store user data, the configuration arrays 106, 108, 110 may be used to store configuration information, and the logic 112 may be used to select a value for the configuration information if the configuration arrays 106, 108, 110 provide inconsistent information. The data array 104 may include a non-volatile memory array 114 and support logic 116 for programming the memory array 114. Likewise, the one or more configuration arrays 106, 108, 110 may each include a non-volatile memory array 118, 120, 122, respectively, and support logic 124, 126, 128, respectively. The logic 112 may include majority voting logic 130 and, in some embodiments, dissent detection logic 132. The logic 112 may not be required in embodiments with only a single configuration array 106 in which case the configuration array 106 may be coupled directly to the data array 104.

The data array 104 and the configuration array 106 may include any type of memory arrays including arrays comprising two-terminal memory cells, three dimensional (3D) memory (e.g., any memory that includes two or more active memory elements vertically arranged), antifuse based memory cells, fuse based memory cells, flash memory cells, NAND flash memory cells, electrically erasable programmable memory cells, ultraviolet erasable programmable memory cells, magnetic memory cells, one time programmable memory cells, ferroelectric random access memory (RAM) cells, carbon nano-tube based memory cells, etc. The data array 104 and the configuration array 106 may be of any size, for example, such as 64 bits, 64 megabits, 64 gigabytes, 64 terabytes, etc. Other size memories may be used. In some embodiments, the data array 104 may be a stand alone memory array and in other embodiments the data array 104 may be part of a larger system such as a general purpose computer or an embedded controller.

The data array 104 may be adapted to store any type of information including general user data. The support logic 116 associated with the data array 104 may be adapted to program (e.g., write to) and configure the data array. The support logic 116 may include latches for storing incoming configuration information (e.g., trimbit latches), word and bit line decoders, read and write voltage regulators, a page register, etc. Separate from user data or information stored in the data array 104, the data array 104 may be programmed and configured based on a plurality of parameters referred to herein as configuration information. The configuration information may include values for selecting among various modes of operation, voltage sensing levels, voltage regulator control levels, trimbit values, trimfuse values, voltage reference levels, and the like. In some embodiments, the configuration information may also define the logical structure (e.g., the capacity, the address space, the row and/or column width, etc.) of the data array 104.

As indicated above, the configuration array 106, which may store a copy of the configuration information, may be identical to the data array 104. However, the configuration array 106 may include a smaller memory array 118 (and associated support logic 124) than the data array 104 to save space on the substrate 102 and/or simply because only a limited amount of memory is needed to store the configuration information relative to the amount of user data capacity of the data array 104. As will be described in more detail below, the physical orientation and layout of the wordlines and bitlines of the configuration array 106 and the data array 104 may be the same. This may insure that the memory arrays 114, 118, perform similarly with regards to electrical characteristics and do not include variations that may occur as the result of having different circuit orientations relative to the substrate 102 (e.g., variations due to marginalities). In some embodiments, the support logic 124 of the configuration array 106 may be adapted to receive the configuration information from a host (not shown). In other words, as part of an initial configuration process (e.g., during manufacturing or during a pre-use "formatting" operation), data representative of the configuration information may be programmed into (e.g., written into) the configuration array 106 via the support logic 124 using latches, registers, and/or buffers in the support logic 124.

In operation with only one configuration array, once configuration information is programmed into the configuration array 106, a control signal may be used to initiate a read of the configuration information. The read value is passed to the support logic 116 of the data array 104 and is used to configure the memory array 114 of the data array 104.

In operation with multiple configuration arrays, once identical configuration is programmed into each of the configuration arrays 106, 108, 110, a control signal may be used to initiate a read of the configuration information. For example, scan chains in the support logic 124, 126, 128 of the configuration arrays may be used to program the configuration information into the configuration arrays 106, 108, 110. The configuration information from the same memory locations in each of the different configuration arrays 106, 108, 110 is transferred to the majority voting logic 130 to be compared. The majority voting logic 130 is adapted to select the most likely correct value of the configuration information based on the most frequently occurring value from among the plurality of configuration arrays 106, 108, 110. The selected value is passed to the support logic 116 of the data array 104 and is used to configure the memory array 114 of the data array 104.

Figure 2:
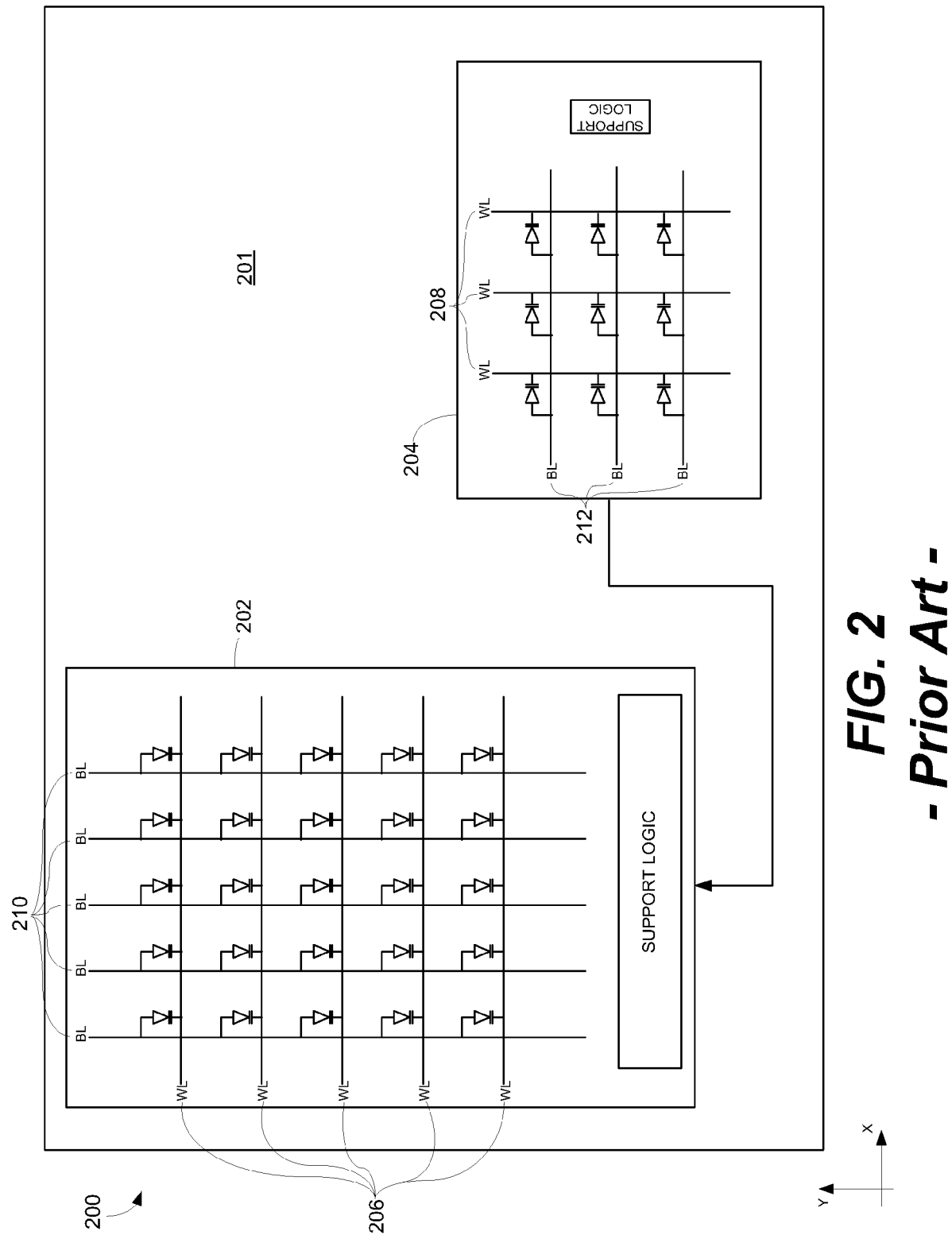
FIG. 2 is a schematic block diagram of a memory device that includes a data array and a memory array with different orientations.

Turning to FIG. 2, a schematic diagram depicting a memory circuit 200 on a substrate 201 is provided. Memory circuit 200 is an example of a memory device with differing relative orientations between the data array circuit 202 and the configuration array circuit 204. Note that the wordlines 206 of the data array circuit 202 run in the X direction (as indicated by the X reference axis) while the wordlines 208 of the configuration array circuit 204 run in the Y direction (as indicated by the Y reference axis). Likewise, note that the bitlines 210 of the data array circuit 202 run in the Y direction while the bitlines 212 of the configuration array circuit 204 run in the X direction. As mentioned above, these differing orientations relative to the substrate may create differences in the operation of the two circuits 202, 204 that may result in failures in one circuit as process or other adjustments are made to improve the other circuit. More specifically, it may be determined, for example, that the width of the lines that run in the X direction should be narrowed and that the width of the lines that run in the Y direction should be increased to adjust for a process sensitivity which if not addressed can result in unreliable operation of the data array and/or reduced yield.

For example, in a semiconductor processing step involving plasma deposition, undesirable holes may be inadvertently formed in the conductors. In this example, the holes may actually result in open circuits and/or conductors that end up behaving like fuses at some voltages. By widening all lines running in the Y direction and narrowing all lines running in the X direction, the effects of the holes on the data array 202 may be avoided because the bitlines 210 are made wider, for example. However, if the data array circuit 202 and the configuration array circuit 204 are disposed in different orientations, as depicted in FIG. 2, the adjustment to the lines running in the X direction, for example, may aggravate the problem in the configuration array circuit 204 (e.g., because the bitlines 212 are narrowed) and result in more open circuits and further reduced yield.

Figure 3:
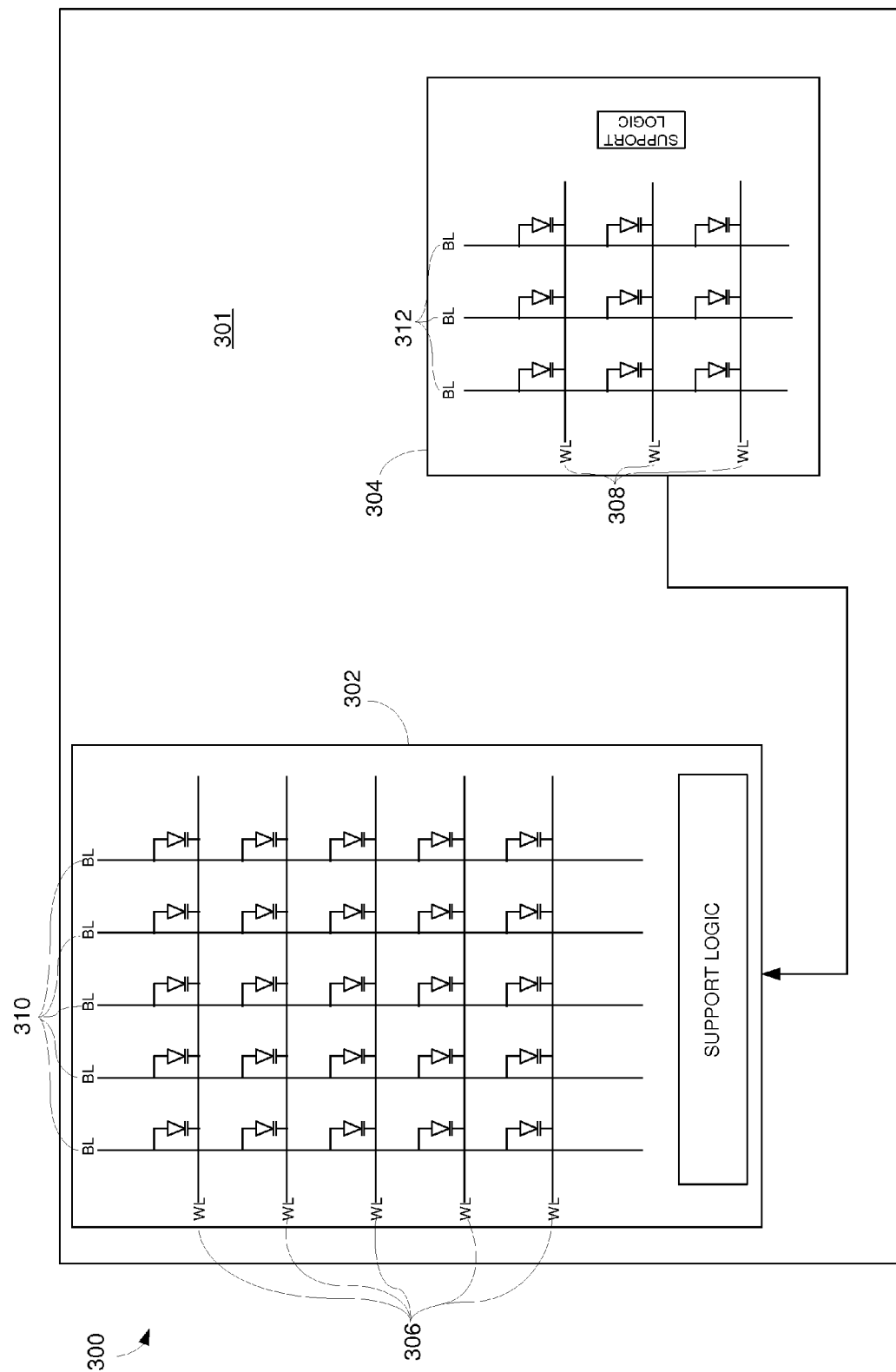
FIG. 3 is a schematic block diagram of a memory device that includes a data array and a memory array with the same orientation according to some embodiments of the present invention.

Turning to FIG. 3, a schematic diagram depicting a memory circuit 300 on a substrate 301 is provided. Memory circuit 300 is an example of a memory device with the same relative orientations between the data array circuit 302 and the configuration array circuit 304. Note that the wordlines 306 of the data array circuit 302 run in the X direction (as indicated by the X reference axis) and the wordlines 308 of the configuration array circuit 304 also run in the X direction. Likewise, note that the bitlines 310 of the data array circuit 302 run in the Y direction (as indicated by the Y reference axis) and the bitlines 312 of the configuration array circuit 304 also run in the Y direction.

Consider again the example discussed above with respect to the memory circuit 200 of FIG. 2, but now instead with the memory circuit 300 of FIG. 3. A plasma deposition processing step results in holes in the conductors. Widening all lines running in the Y direction and narrowing all lines running in the X direction still results in improvements to the data array 310. However, because all lines running in the X direction are now wordlines 306, 308 and all lines running in the Y direction are bitlines 310, 312, adjustments made to improve the data array 302 also results in improvements to the configuration array 304.

Further, in addition to making the orientations of the data array 302 and the configuration array 304 the same, in some embodiments, other elements of the arrays 302, 304 may be built, laid out, and/or arranged the same. For example, the sensing orientation may be made the same between the arrays 302, 304. More specifically, bitline sensing of the diodes of memory cells can be done on the cathode side in both arrays 302, 304 or on the anode side in both arrays 302, 304.

The layout (e.g., shape, size, geometry, routing, etc.) of the conductors that form the bitlines 310, 312 and the wordlines 306, 308 can be made substantially the same in both arrays 302, 304. In particular, the layout of the bitlines 310, 312 and the wordlines 306, 308 proximate to the arrays 302, 304 (e.g., at the region where they enter the arrays 302, 304, respectively) may be made to be substantially the same. More specifically, as bitlines and wordlines approach and enter the memory array, the width of the lines are typically narrowed to the thinnest conductors achievable by the technology being used. In other words, within a distance of approximately ten times (e.g., 5× to 20×) the minimum bit line pitch to the memory array, the layout of the conductors, which may have been narrowed to the minimum bit line pitch, may be made substantially the same in both arrays 302, 304. Optical proximity corrections (e.g., a photolithography enhancement technique used to compensate for image errors due to diffraction and/or process effects) made to the various layouts may also be replicated in both arrays 302, 304.

Via (e.g., vertical interconnects that span two interconnect layers) and zia (e.g., vertical interconnects that span more than two interconnect layers) contact regions may be located in the same relative positions in both arrays 302, 304. In some embodiments, the layout of the wordline drivers (e.g., the last stage decoders used to select between selected and unselected bias voltages) for the wordlines 306, 308, can be made substantially the same in both arrays 302, 304. Likewise, the layout of the bitline drivers (e.g., the last stage decoders) for the bitlines 310, 312, can be made substantially the same in both arrays 302, 304. Additionally, the layout of the sense amplifiers and the layout of the voltage regulators used in both arrays 302, 304 may be made to be substantially the same.

The above example embodiments are described with respect to programmable memories. However, the principles of the present invention have application to other types of memories, including those currently existing and those contemplated to use new technology being developed.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

The invention claimed is:

1. A memory comprising:
   a substrate including:
   a data array; and
   a configuration array associated with, but separate from, the data array and adapted to store configuration information for configuring the data array,
   wherein the configuration array and the data array are disposed on the substrate in a same orientation as each other relative to the substrate, and
   wherein the configuration array includes a plurality of zia contact regions that are disposed in substantially similar relative locations in the configuration array as a plurality of zia contact regions disposed in the data array.

2. The memory of claim 1 wherein both the data array and the configuration array include both a plurality of wordlines and a plurality of bitlines, wherein the plurality of wordlines in the data array extend in a first direction and the plurality of wordlines in the configuration array also extend in the first direction, and wherein the plurality of bitlines in the data array extend in a second direction and the plurality of bitlines in the configuration array also extend in the second direction.

3. The memory of claim 1 wherein the data array and the configuration array each includes at least one of: a substantially similar wordline driver layout, a substantially similar bitline driver layout, a substantially similar conductor layout proximate to the arrays, a substantially similar diode sensing orientation, a substantially similar sense amplifier layout, and a substantially similar voltage regulator layout.

4. The memory of claim 1 wherein the data array includes support logic and the configuration information is associated with operation of the support logic.

5. The memory of claim 1 wherein the data array includes a plurality of non-volatile memory cells.

6. The memory of claim 1 wherein the data array includes a plurality of two-terminal memory cells.

7. The memory of claim 1 wherein the data array includes at least one of flash memory, NAND flash memory, electrically erasable programmable memory, ultraviolet erasable programmable memory, magnetic memory, one time programmable memory, ferroelectric RAM, and carbon nanotube based memory.

8. The memory of claim 1 wherein the configuration information defines a logical structure of the data array.

9. The memory of claim 1 wherein the configuration information includes at least one of trimbit values, reference voltage values, and mode selection values.

10. The memory of claim 1 wherein the configuration array includes a plurality of non-volatile memory cells.

11. The memory of claim 1 wherein the configuration array includes a plurality of two-terminal memory cells.

12. The memory of claim 1 wherein the configuration array includes at least one of fuse based memory and antifuse based memory.

13. The memory of claim 1 wherein the data array and the configuration array each include a plurality of 3D memory cells.

14. A non-volatile memory system comprising:
a data array; and
a configuration array associated with, but separate from, the data array,
wherein the configuration array and the data array are disposed in a same orientation relative to each other, and
wherein the configuration array includes a plurality of zia contact regions that are disposed in substantially similar relative locations in the configuration array as a plurality of zia contact regions disposed in the data array.

15. The memory of claim 14 wherein the data array and the configuration array include a plurality of wordlines and a plurality of bitlines, wherein the plurality of wordlines in the data array extend in a first direction and the plurality of wordlines in the configuration array extend in the first direction, and wherein the plurality of bitlines in the data array extend in a second direction and the plurality of bitlines in the configuration array extend in the second direction.

16. The memory of claim 14 wherein the configuration array includes a plurality of wordline drivers that are laid out substantially similar to a plurality of wordline drivers of the data array.

17. The memory of claim 14 wherein the configuration array includes a plurality of bitline drivers that are laid out substantially similar to a plurality of bitline drivers of the data array.

18. The memory of claim 14 wherein the configuration array includes a diode sensing orientation that is substantially similar to a diode sensing orientation of the data array.

19. The memory of claim 14 wherein the configuration array includes a plurality of sense amplifiers that are laid out substantially similar to a plurality of sense amplifiers of the data array.

20. The memory of claim 14 wherein the configuration array includes a plurality of voltage regulators that are laid out substantially similar to a plurality of voltage regulators of the data array.

21. The memory of claim 14 wherein the configuration array includes a plurality of conductors proximate to the configuration array that are laid out substantially similar to a plurality of conductors proximate to the data array.

22. A memory comprising:
a substrate including:
a data array; and
a configuration array associated with, but separate from, the data array and adapted to store configuration information for configuring the data array,
wherein the configuration array includes a plurality of bitline drivers that are laid out substantially similar to a plurality of bitline drivers of the data array, and
wherein the configuration array includes a diode sensing orientation that is substantially similar to a diode sensing orientation of the data array.

23. A memory comprising:
a substrate including:
a data array; and
a configuration array associated with, but separate from, the data array and adapted to store configuration information for configuring the data array,
wherein the configuration array includes a plurality of wordline drivers that are laid out substantially similar to a plurality of wordline drivers of the data array, and
wherein the configuration array includes a plurality of conductors proximate to the configuration array that are laid out substantially similar to a plurality of conductors proximate to the data array.

24. A non-volatile memory system comprising:
a data array; and
a configuration array associated with, but separate from, the data array and adapted to store configuration information for configuring the data array,
wherein the data array and the configuration array include a plurality of wordlines and a plurality of bitlines, wherein the plurality of wordlines in the data array extend in a first direction and the plurality of wordlines in the configuration array extend in the first direction, and wherein the plurality of bitlines in the data array extend in a second direction and the plurality of bitlines in the configuration array extend in the second direction,
wherein the configuration array includes a plurality of wordline drivers that are laid out substantially similar to a plurality of wordline drivers of the data array,
wherein the configuration array includes a plurality of bitline drivers that are laid out substantially similar to a plurality of bitline drivers of the data array,
wherein the configuration array includes a plurality of zia contact regions that are disposed in substantially similar relative locations in the configuration array to a plurality of zia contact regions in the data array,
wherein the configuration array includes a diode sensing orientation that is substantially similar to a diode sensing orientation of the data array,
wherein the configuration array includes a plurality of sense amplifiers that are laid out substantially similar to a plurality of sense amplifiers of the data array,
wherein the configuration array includes a plurality of voltage regulators that are laid out substantially similar to a plurality of voltage regulators of the data array, and
wherein the configuration array includes a plurality of conductors proximate to the configuration array that are laid out substantially similar to a plurality of conductors proximate to the data array.

* * * * *